United States Patent [19]
Mourou et al.

[11] Patent Number: 6,160,252
[45] Date of Patent: Dec. 12, 2000

[54] PHOTOCONDUCTIVE ELEMENT AND METHOD FOR MEASURING HIGH FREQUENCY SIGNALS

[75] Inventors: Gerard A. Mourou, Ann Arbor, Mich.; Joo-Hiuk Son, Albany, Calif.; Joungho Kim, Seoul, Rep. of Korea

[73] Assignee: Regents of The University of Michigan

[21] Appl. No.: 09/128,491

[22] Filed: Aug. 4, 1998

(Under 37 CFR 1.47)

Related U.S. Application Data

[62] Division of application No. 08/271,039, Jul. 6, 1994, Pat. No. 5,844,288.

[51] Int. Cl.$^7$ .......................... H01L 27/14; H01L 29/40; H01L 31/028; G01R 31/00
[52] U.S. Cl. ..................... 250/214.1; 257/21; 257/431; 324/96
[58] Field of Search ........................... 250/214.1, 214 R; 356/364, 365; 324/96, 765, 766, 767; 257/21, 431, 1, 5, 7, 608, 610, 612

[56] References Cited

U.S. PATENT DOCUMENTS

| | | | |
|---|---|---|---|
| 4,618,819 | 10/1986 | Mourou et al. | 324/77 K |
| 4,681,449 | 7/1987 | Bloom et al. | 356/364 |
| 4,978,910 | 12/1990 | Knox et al. | 324/96 |
| 5,142,224 | 8/1992 | Smith et al. | 324/158 R |
| 5,844,288 | 12/1998 | Mourou et al. | 257/431 |
| 5,864,166 | 1/1999 | Stoudt et al. | 257/431 |

OTHER PUBLICATIONS

Matloubian et al., Wide–Band Millimeter Wave Characterization of Sub–0.2 Micrometer Gate–Length AlINAs/GaINAs HEMT's, *IEEE Microwave and Guided Wave Letters*, 1(2):32–34, Feb. 1991.

Matloubian et al., "Picosecond Optoelectronic Measurement of Parameters and Optical Response of an AlGaAs/GaAs, HBT," *IEEE Transactions on Microwave Theory and Techniques*, 38(5):683–686, May 1990.

Doany et al., "Carrier Lifetime Versus Ion–Implantation Dose in Solicon on Sapphire," *Appl. Phys. Lett.*, 50(8):460–462, Feb. 23, 1987.

Auston et al., "Picosecond Optoelectronic Detection, Sampling, and Correlation Measurements in Amorphous Semiconductors," *Appl. Phys. Lett.*, 37(4):371–373, Aug. 15, 1980.

Gupta et al., "Subpicosecond Carrier Lifetime in GaAs Grown by Molecular Beam Epitaxy at Low Temperatures," *Appl. Phys. Lett.*, 59(25):3276–3278, Dec. 16, 1991.

Valdmanis et al., "Subpicosecond Electrooptic Sampling: Principles and Applications," *IEEE Journal of Quantum Electronics*, QE–22(1):69–78, Jan., 1986.

*Primary Examiner*—John R. Lee
*Attorney, Agent, or Firm*—Fulbright & Jaworski

[57] ABSTRACT

A photoconductive method or apparatus for measuring high frequency signals using a relatively inexpensive photoconductive material with a relatively long duration or recombination time. The photoconductive method or apparatus utilizes a photoconductive element of photoconductive material such that the duration or recombination time of the photoconductive material is longer than the pulse width of the signal to be measured. As such, the photoconductive element produces a step function response to the signal to be measured rather than a rectangular response with respect to the signal to be measured. The photoconductive element avoids the need to sacrifice measurement sensitivity by introducing defects in the photoconductive material to shorten the recombination time or duration. The measurement bandwidth of the photoconductive element is not limited by the recombination time of the photoconductive material which is mostly dominated by the carrier lifetime. The measurement bandwidth for the photoconductive element is limited by the pulse width of the optical signal driving the photoconductive element which can be very short duration thereby providing improved resolution. As such, the photoconductive element can comprise a cheaper photoconductive material which has a longer duration or recombination time but with a higher sensitivity and improved measurement resolution.

21 Claims, 4 Drawing Sheets

PHOTOCONDUCTIVE ELEMENT AND METHOD FOR MEASURING HIGH FREQUENCY SIGNALS

This is a divisional of application Ser. No. 08/271,039 filed Jul. 6, 1994 now U.S. Pat. No. 5,844,288.

This invention was made with Government Support under grant no. PHY-8920108 awarded by the National Science Foundation. The Government has certain rights in this invention.

FIELD OF THE INVENTION

This invention relates to electronic measuring techniques generally and, in particular, a photoconductive method and element for measuring high frequency signals.

BACKGROUND OF THE INVENTION

In recent years, rapid progress has been made in the design and development of ultrafast electronic and optoelectronic devices. Sampling techniques are the best method to measure fast varying electrical signals in such devices. One sampling method is the electro-optic sampling (EOS) technique which utilizes the Pockels' effect of a birefringent electro-optical crystal. However, the measurement sensitivity of the EOS technique is low due to the small change in the index of refraction with the electric field change. Better measurement sensitivity is obtainable using another method called the photoconductive sampling (PCS) technique.

The PCS technique uses a very-short-duration optoelectronic gate to map out fast electrical transients. The gate, which consists of a photoconductive gap, is usually fabricated on semiconductor materials. The photoconductive response of the material determines the sensitivity and the temporal response of the measurement. The temporal response, i.e., the measurement bandwidth, is limited because the sampled waveform is the convolved result of the real electrical signal waveform and the response function of the gate. Therefore, the shorter the gate response, the more accurately the electrical signal can be measured. The short gate response has been achieved with the fabrication of photoconductive gaps on materials having a subpicosecond lifetime of photogenerated carriers. Typical materials used are the ion-damaged silicon-on-sapphire and the low-temperature-grown GaAs. The short-carrier-lifetime has been attained using defects in the material. The defects reduce the mobility of carriers, resulting in the decrease of the measurement sensitivity, although the decreased sensitivity is still much higher than that of the EOS technique.

The impulse samplers have been used to characterize high frequency microwave and millimeter wave devices and circuits. Since these high speed devices and circuits can have frequency responses over 100 GHz, which conventional electronic measurement systems cannot reach, optical measurement techniques such as photoconductive sampling have been successfully adopted for the analysis of such devices and circuits.

The conventional PCS technique using a short-duration gate can be described as follows. A series of a repeating voltage signal is represented by f(t). If f(t) is the voltage signal to be sampled and h(t) is the rectangular response function of the sampling gate due to an optical signal driving the sampling gate, and these two signals are perfectly synchronized, then the measured signal F(t) is the cross-correlation between f(t) and h(t):

$$F(t)=\int_{-\infty}^{\infty} f(t')h(t'-t)dt'. \quad (1)$$

For a rectangular gate-function h(t) given by $h(t)=h_0$, for $0 \leq t \leq \tau$ $h(t)=0$, for $t<0$ or $t>\tau$, \quad (2)

the signal F(t) becomes $$F(t) = h_0 \int_{t}^{t+\tau} f(t')dt'. \quad (3)$$

If the gate duration $\tau$ is small enough compared to the signal under study f(t), the signal that is measured F(t) is given by $F(t) \approx h_0 \tau f(t)$ \quad (4)

and F(t) is proportional to the signal under study f(t).

As such, in order to have a large F(t), it is necessary to have a large $h_0$ while maintaining a large $\tau$. Here, $h_0$ is the sensitivity of the photoconductive gate response and is proportional to the mobility of the material which is very material dependent. Because $h_0$ is usually in a trade-off relationship with the gate recovery time $\tau$, it is almost impossible to get high sensitivity with picosecond time resolution in a conventional photoconductive sampling circuit. Thus, a need exists for a technique that has very high measurement sensitivity but does not sacrifice the measurement time resolution.

SUMMARY OF THE INVENTION

The present invention involves a photoconductive method or apparatus for measuring high frequency signals using a relatively inexpensive photoconductive material with a relatively long duration or recombination time. The photoconductive method or apparatus utilizes a photoconductive element of photoconductive material such that the duration or recombination time of the photoconductive material is longer than the pulse width of the signal to be measured. As such, the photoconductive element produces a step-function response to the optical signal driving the photoconductive element with respect to the signal being measured rather than a rectangular response with respect to the signal to be measured.

The photoconductive element avoids the need to sacrifice measurement sensitivity by introducing defects in the photoconductive material to shorten the recombination time or duration. The measurement bandwidth of the photoconductive element is not limited by the recombination time of the photoconductive material which is mostly dominated by the carrier lifetime. The measurement bandwidth for the photoconductive element is limited by the pulse width of the optical signal driving the photoconductive element which can be of very short duration, thereby providing improved resolution. As such, the photoconductive element can comprise a cheaper photoconductive material which has a longer duration or recombination time but with a higher sensitivity and improved measurement resolution.

In accordance with the principles of the present invention, the photoconductive element can be utilized in a step-function sampler as a step-function gate that responds to an electrical signal on a transmission or communication line and an optical signal driving the gate by producing a measurement signal. The measurement signal represents the cross-correlation between the electrical pulse being measured and a step-function response of the photoconductive material to the optical signal. Moreover, the measurement bandwidth of the present invention is limited by the pulse width of the optical signal driving the photoconductive element, i.e., the rise time of the step-function. Thus, the step-function gate offers improved time resolution for sampling because the measurement bandwidth is limited by the pulse width for the optical signal driving the step-function gate rather than the typically longer gate durations for even short-duration gates.

The step-function sampler can be applied anywhere the conventional impulse PCS sampler is used. For characterization of the performance of microwave and millimeter wave devices and circuits, the step function sampler can be used in exactly the same manner as the conventional impulse sampler is used. The step-function sampler, however, offers much better sensitivity and time resolution than the impulse sampler as described above.

Another advantage of the step-function sampler over conventional PCS impulse sampling is on-wafer sampling. On-wafer sampling is a circuit characterization technique which tests devices and circuits before the individual circuit is diced from the wafer of the circuits. The impulse sampler is not suitable for on-wafer sampling because most of the wafers have a long carrier lifetime and complicated steps are needed to get a short carrier lifetime gate. However, since the step-function sampler utilizes the long carrier lifetime of the material, it is convenient to use the step-function sampler or technique for on-wafer sampling, exploiting many of the advantages of the photoconductive sampler, such as high sensitivity and wide bandwidth. Therefore, the step-function sampler will be useful for the high frequency circuit industry because an on-wafer sampling test is and will be essential in the manufacture of devices and circuits.

Moreover, photoconductive sampling according to the present invention can be applied to testing digital circuits, as well as high frequency analog circuits, optical transmission lines, or communication lines. A photoconductive sampler has not been extensively used for digital circuit tests yet because electrical measurement systems have been able to test performance of the digital circuits which operate below a few tens of gigabits per second at present. However, since the speed of digital circuits are getting faster and faster, there is a need for optical test techniques for high speed digital and analog circuits. Accordingly, the step-function sampler can be utilized for the high-speed digital, analog, or optical circuit tests.

The photoconductive element of the present invention can also be applied to fast photoconducting optical detectors. The measured waveform in the fast photoconducting detector using the photoconductive element is the time integral of the optical signal under study. The time integral of the signal under study represents a correlation between the optical signal and the response of the photoconductive element to the optical signal. Since this technique does not require the use of fast recovery material for creating the rectangular response of conventional photoconducting optical detectors, it is very useful for subpicosecond x-ray detection where ultrafast materials with high mobility do not exist.

A preferred embodiment of such a detector uses the photoconductive element of the present invention constructed out of semiconducting materials which yield a very long carrier recovery time or recombination time compared to the optical pulse width of the optical signal to be measured. The detector itself can be the photoconductive element forming a gap in a transmission line which is constructed on a slow photoconducting substrate with a long recombination time. The gap is biased with a dc voltage of suitable value. The optical signal under study is focused into the photoconductive element, and the signal-under-study makes the photoconductive element conductive and allows a measurement signal to traverse the transmission line. The measurement signal represents the time integral of the optical signal, and a probe beam from a laser picks up this signal at the fast photoconductor gate. A data acquisition system then acquires the measurement signal for analysis and display. The actual optical signal is obtained by differentiating the measurement signal.

DESCRIPTION OF THE DRAWINGS

Other aspects and advantages of the present invention may become apparent upon reading the following detailed description and upon reference to the drawings in which.

Figure 1:
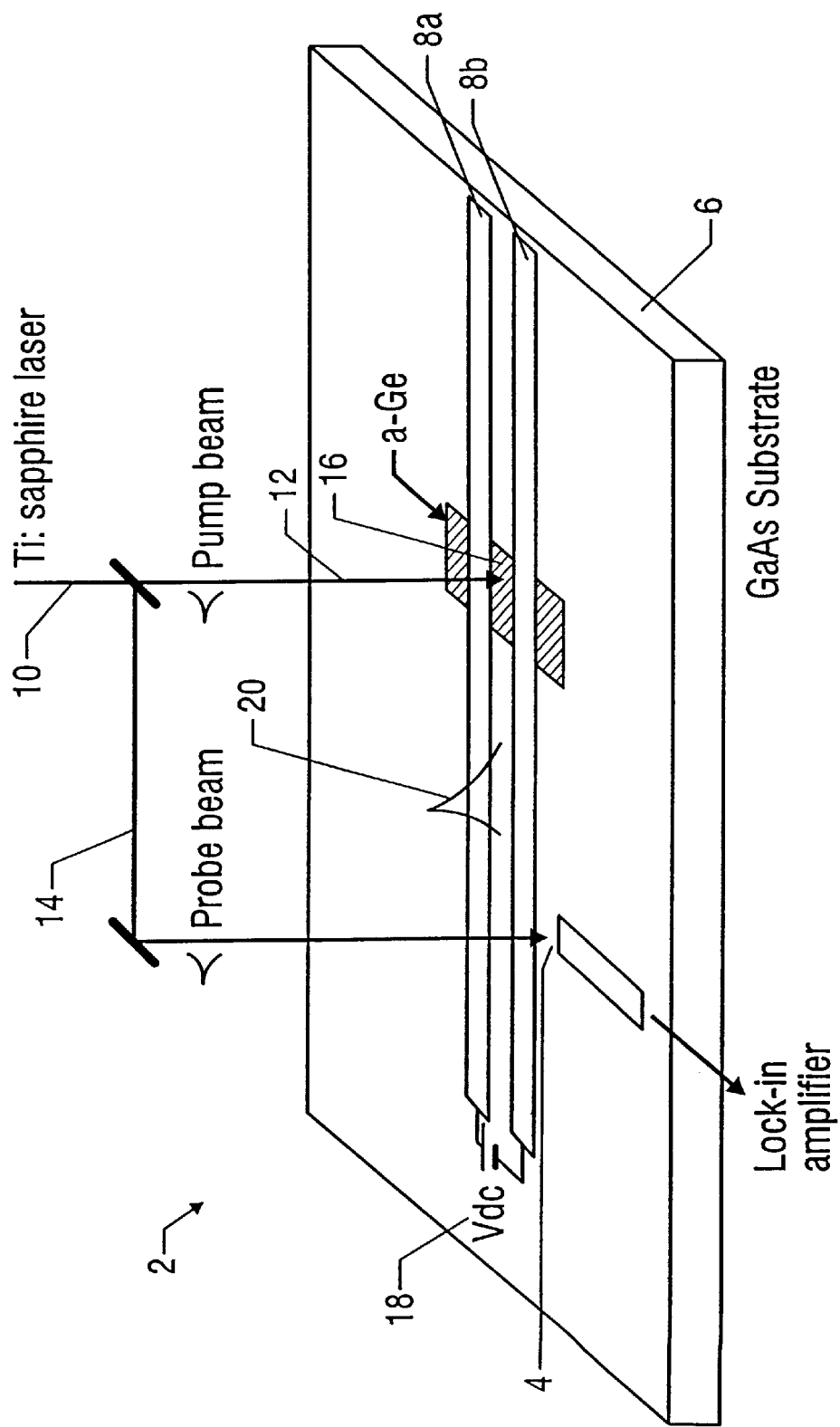
FIG. 1 shows an experimental scheme utilizing the photoconductive element according to the present invention.

While the invention is susceptible to various modifications and alternative forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION OF THE PREFERRED EMBODIMENT

This invention uses a photoconductive element of a photoconductive material having a longer duration or recombination time than the pulse width of the signal to be measured which results in a step-function response from the photoconductive element with respect to the signal to be measured. The higher mobility, photoconductive material of the photoconductive element has a higher sensitivity than a defected, short-duration photoconductive gate which has a recombination time shorter than the pulse width of the signal to be measured, resulting in a conventional rectangular response with respect to the signal to be measured.

Referring to the drawings and particularly to FIG. 1, a step-function sampler 2 is shown which utilizes the photoconductive element as a step-function gate 4 on an undoped GaAs substrate 6 with two coplanar conductive strips 8a and 8b. A self-mode locked Ti-sapphire laser (not shown) produces a beam 10 which, in turn, is split into two synchronous beams: a pump beam 12 and a probe beam 14. The pump beam 12 is focused on an amorphous Ge region of gap 16 which generates a series of picosecond electrical signals in synchronization with the probe beam 14. Alternatively, a single electrical pulse can be generated which is delayed by delay circuitry (not shown). The amorphous Ge (a-Ge) gap 16 is in between the coplanar strips 8a and 8b for the picosecond pulse generation. A dc bias 18 of preferably between one and one hundred volts is applied to bias the a-Ge gap 16. As the pump beam 12 hits the amorphous-Ge gap 16, electron hole pairs are generated and, analogous to a switch, the gap closes. With the "switch" closed, the electrical pulse 20 traverses the transmission line 8a and 8b and is sampled by the step function gate 4 which is responsive to the probe beam 14, according to a step-function response of the undoped substrate 6. Successive pulses 20 are sampled at successive points to reconstruct the pulse 20. The response function of the photoconductive element 4 is characterized as a step function because the duration of the photoconductive material is longer than the pulse width of the signal being sampled for proper sampling. The step-function gate 4 is shown one millimeter away from where the excitation takes place in the a-Ge gap but shorter distances are preferable to get higher time-resolution. As shown in FIG. 1, the step-function gate 4 can be constructed from the same material as the substrate and does not have to be specifically doped as conventional pulse detectors do.

Unlike all previous gates, the step-function gate 4 does not have to be specially treated with material defects to create a short carrier lifetime. The step-function sampler 2 can have very large sensitivity $h_0$ and adjustable time resolution, $\tau$. If the sample signal is f(t) and the step-function response h'(t) is given by:

$$h'(t) = h'_0 \text{ for } t \geq 0$$

$$h'(t) = 0, \text{ for } t < 0, \quad (5)$$

then the measured signal F(t) becomes $$F(t) = h'_0 \int_t^\infty f(t')dt'. \quad (6)$$

This equation can also be expressed as $$F(t) = h'_0 \int_{-\infty}^{\infty} f(t')dt' - h'_0 \int_{-\infty}^{t} f(t')dt' = C - h'_0 \int_{-\infty}^{t} f(t')dt' \quad (7)$$

where C is a constant. From this equation, it can be seen that the cross-correlation of the signal under study with a step function is proportional to the signal integral. The signal under study can be recovered from F(t) using mathematical differentiation as follows:

$$F(t) - F(t + \tau) = -h'_0 \int_{-\infty}^{t} f(t')dt' + h'_0 \int_{-\infty}^{t+\tau} f(t')dt' \quad (8)$$

$$= h'_0 \int_t^{t+\tau} f(t')dt'.$$

For a small time interval $\tau$ which can be arbitrarily introduced, $$F(t) - F(t+\tau) = h'_0 \tau f(t). \quad (9)$$

Thus, the signal under study can be recovered using a step-function gate.

However, since it is very difficult to produce a perfect step-function, one can use a step-function or sampling function with a fast rise time limited by the optical pulse and preferably with a long recombination time of 10–100 times the pulse width of the signal under test. When this quasi-step-function h(t) is used for the gate function, the signal recovered from the measurement is given by:

$$F(t)-F(t+\tau) = \int_{-\infty}^{\infty} f(t')h(t'-t)dt' - \int_{-\infty}^{\infty} f(t')h(t'+\tau-t)dt'. \quad (10)$$

For the slow varying f(t) and small $\tau$, the expression becomes $$F(t) - F(t+\tau) = \int_{-\infty}^{\infty} f(t')h(t'-t)dt' - \quad (11)$$

-continued $$\int_{-\infty}^{\infty} f(t')\left\{h(t'-t) - \tau \frac{dh(t'-t)}{dt}\right\}dt'$$

$$= \tau \int_{-\infty}^{\infty} f(t') \frac{dh(t'-t)}{dt}dt'.$$

The difference F(t)–F(t+τ) is equal to the cross-correlation between the signal and the time derivative of the quasi-step-function. It should be noted that the equivalent sampling function dh(t'–t)dt has a duration as short as the rise time of the quasi-step-function h(t) which is very short in the case of photoconductive sampling. The rise time is mostly determined by the optical pulse width, which can be shorter than 100 fs.

From Eq. (11) the advantages of using the photoconductive element of the present invention as compared to conventional impulse sampling become apparent.

First, the photoconductive element or method of the present invention has ultimate temporal resolution which is limited only by the pulse width of the optical signal driving the photoconductive element. The time resolution can be as short as 100 fs because it is determined by the rise time of the step function and the rise time is almost the same as the optical signal pulse width. On the other hand, the temporal resolution of a conventional PCS technique is around 500 fs, as imposed by the photoconductive gate duration.

Second, the maximum value of dh(t–t')/dt is proportional to the mobility of the material. Therefore, the photoconductive step-function sampler using the photoconductive element of the present invention can provide a much larger amplitude of the signal over the conventional impulse sampler by a factor of 10 to 100 if we can use an undoped, low-defect material to exploit the highest mobility. The conventional impulse sampling technique, however, must use a highly-defected, very low mobility material to provide a short-duration sampling gate.

Finally, the signal amplitude is proportional to $\tau$ for both the impulse and the step-function sampling techniques. Therefore, the step-function technique can give a larger signal by varying $\tau$ while the $\tau$ of the conventional impulse technique is equal to the material recovery time which can't be easily adjusted.

After the electrical signal is generated, the step-function gate 4 samples the event before it can dissipate. As previously stated, a series of signals can be repeated and the sampling point shifted by using different delay times for successive signals, or a single signal can be delayed. A lock-in amplifier (not shown) measures the amplitude of the output which yields a measured signal proportional to the integral of the sampled signal. Successive measured signals can be used to construct a measured waveform. The measured signal from the photoconductive element represents the cross-correlation between the electrical signal being measured and the step-function response of the step-function gate 4. The response function of the photoconductive element 4 is characterized as a step-function because the recombination time of the photoconductive material of the photoconductive element 4 is longer relative to the pulse width of the signal being measured.

Figure 2A:
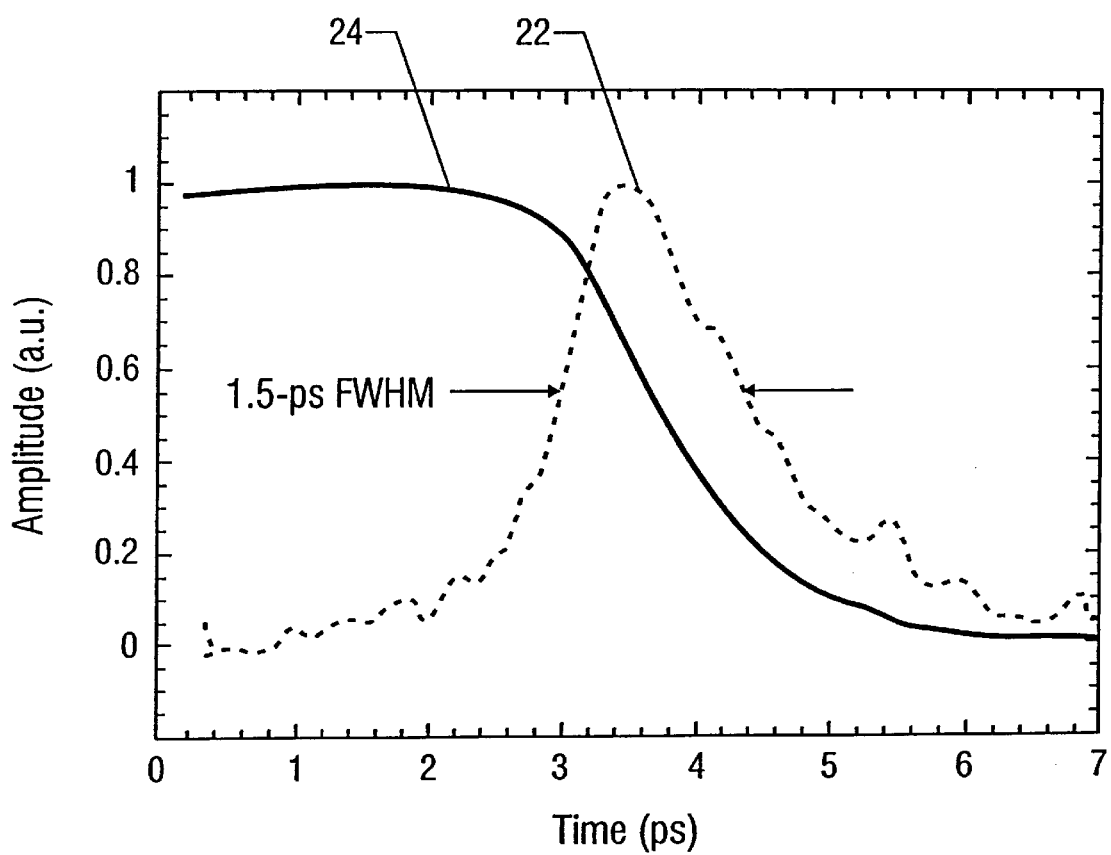
FIG. 2A is a graph showing the measured waveform using the photoconductive element as a solid line and the dotted line waveform representing the sampled signal.

FIG. 2A shows an illustrative measured waveform 24. As described above, the measured waveform 24 is proportional to the integral of the electrical signal being measured at different times along the electrical signal being measured. The dotted line waveform 22 represents the actual signal being measured and is obtained by the subtraction of the measured waveform from the same measured waveform shifted by 100 fs. Alternatively, the dotted line waveform 22 can be obtained by subtracting successive measured signals.

Figure 2B:
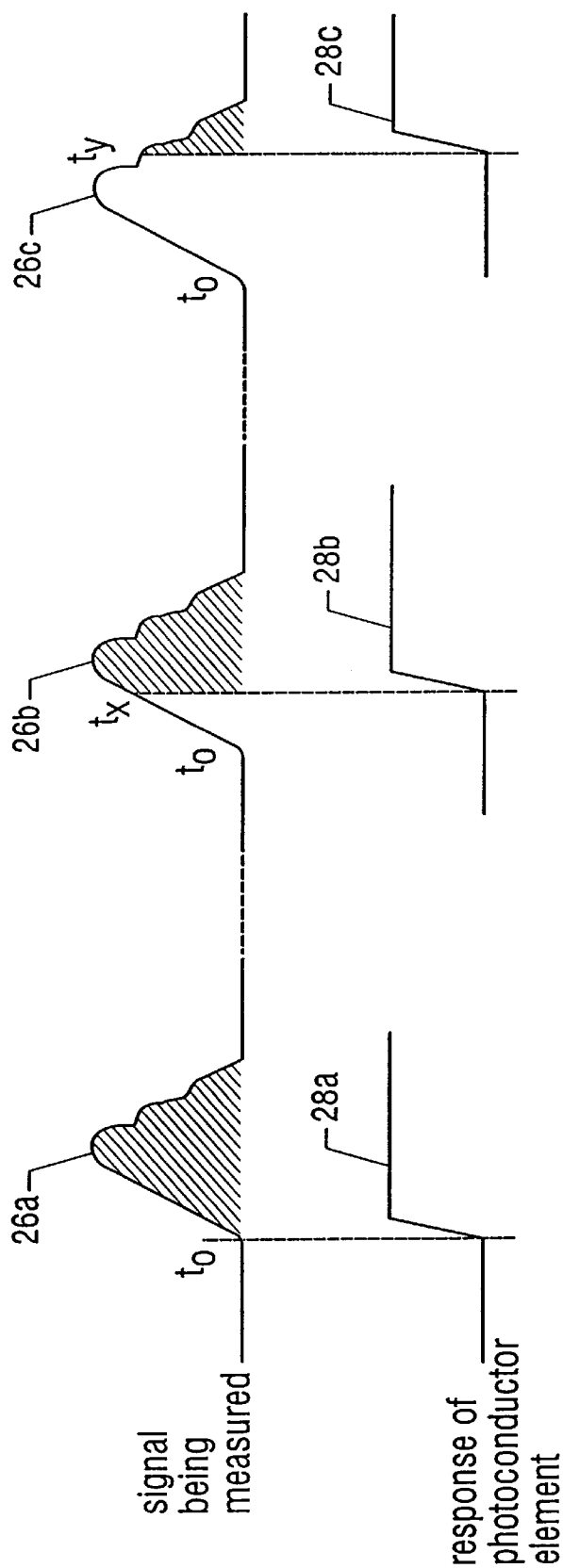
FIG. 2B shows a repeating signal to be measured and the step-function response of the photoconductive element.

The measured waveform 24 is preferably obtained by generating repetitive signals of the signal being measured. As shown in FIG. 2B, repeating pulses 26a–c represent the signal being measured, and step-function responses 28a–c are the resulting responses from the photoconductive element at the different delay times. The photoconductive element 4 is open (not conducting) when the step-function response 28 is low, and the photoconductive element 4 is closed (conducting) when the step-function response is high. The pulse 26a is sampled at time $t_0$ by the photoconductive element 4 which produces a measured signal proportional to the signal integral, i.e. the shaded area of the pulse 26a. The responses 28b–c of the photoconductive element 4 are delayed with respect to $t_0$ obtain different areas of overlap of the repeating electrical pulses 26a–c. As such, the measured waveform 24 represents the different areas under the repeating electrical pulses being measured (shaded areas) from different times delayed with respect to $t_0$. Reconstruction of the signal 22 is accomplished by subtracting the measured waveform 24 from the same measured waveform shifted by the arbitrarily selected time interval of 100 fs, thereby effectively differentiating the entire signal integral to obtain the signal being measured. Incidentally, successive pulses should be substantially the same for accurate reconstruction, but the present invention includes changing successive signals and non-repeating signals which are delayed.

The result is shown as the dotted line waveform 22 which is the reconstruction of the repeating picosecond electrical pulse from the step-function measurements. The rise time of the pulse is 1 ps and the full-width-at-half-maximum (FWHM) is 1.5 ps. The pulse is broader than the measurement resolution of 100 fs. That is not due to the measurement limitation but due to the dispersion of the electrical pulse propagating on the stripline. Another reason is due to the electrical pulse generation using amorphous Ge, which has a carrier lifetime of over 1 ps.

The photoconductive element of the present invention can also be applied to a fast photoconducting detector. Such a detector can be built using semiconductor materials with very long carrier recovery time. Currently high-bandwidth photoconducting detectors are made of fast recovery material. The use of such material, however, has two major drawbacks. First, it is very difficult to find a material with picosecond or subpicosecond response time for many wavelengths, for example, x-rays. Second, ultrafast materials have, in general, very poor mobilities which result in very low responsivities for detectors.

Figure 3:
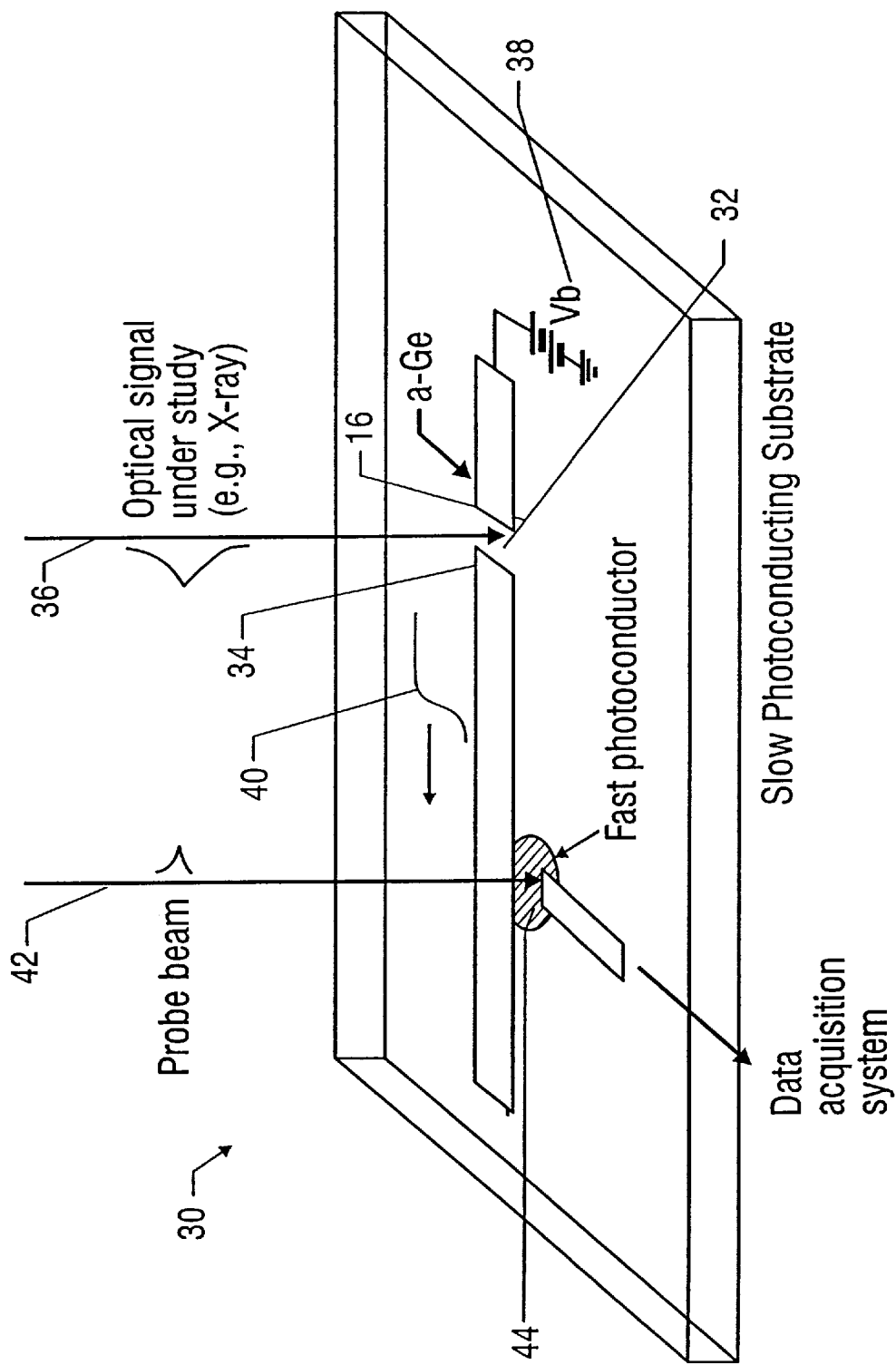
FIG. 3 shows a time integral photodetector using the photoconductive element of the present invention.

FIG. 3 shows an apparatus 30 for measuring high frequency signals using the photoconductive element or detector 32 according to the principles of the present invention. The photoconductive detector 32 is built out of semiconducting materials with a very long carrier recovery time compared to the pulse width of the optical pulse. The photoconductive detector 32 is shown as a gap 32 on a transmission line 34, or an interdigitated gap. The optical signal under study 36, for example an x-ray, is applied to the photoconductive element 32 in the transmission line 34. The element 32 will be biased with a dc or quasi-dc voltage 38. The signal 36 will close the element 32 and produce an electrical signal 40 which propagates along the transmission line 34. The electrical signal 40 is equivalent to the time integral of the optical signal under study (SUS). The electrical signal 40 produced by the element 32 in response to the SUS is given by:

$$F(t) = \int_{-\infty}^{\infty} f(t')h(t'-t)dt' \qquad (12)$$

where h(t) is the material response or step-function response to the optical signal 36. From Eq. 12, the response of the detector 30 is the time integral of the optical signal under study 36. In order to find the SUS f(t), F(t) is subtracted from F(t+τ) where τ is a small time increment chosen by the user or follower:

$$\begin{aligned}F(t)-F(t+\tau) &= \int_{-\infty}^{\infty} f(t')h(t'-t)dt' - \\ & \quad \int_{-\infty}^{\infty} f(t')h(t')h(t'+\tau-t)dt' \\ &= \int_{-\infty}^{\infty} f(t')h(t'-t)dt' - \\ & \quad \int_{-\infty}^{\infty} \left\{h(t'-t) - \tau \frac{d\,h(t'-t)}{dt}\right\}dt' \\ &= \tau \int_{-\infty}^{\infty} f(t') \frac{d\,h(t'-t)}{dt} dt'.\end{aligned} \qquad (13)$$

Since the material response to optical excitation, h(t), for long recovery semiconductors is almost an ideal step function, dh(t–t')/dt is very close to a delta function, δ(t). Therefore, Eq. 13 becomes:

$$F(t)-F(t+\tau) \propto \tau f(t) \qquad (14)$$

and, therefore, this technique can recover the waveform of the SUS.

The electrical signal 40 propagates along the transmission line 34 where the probe beam 42 picks it up in the fast-photoconductor gap 44. From there, a data acquisition system (not shown), as is known in the art, acquires the signal for analysis and display.

Since this technique does not require the use of ultrafast carrier recovery material as compared to techniques employing the usual photoconducting detectors, the material of choice will be the one having the highest mobility in order to get the highest responsivity out of the detector. F(t) can be measured by using the conventional impulse photoconductive sampling technique, with a photoconductive element built on ion-damaged silicon-on-sapphire or low temperature grown GaAs. This method is extremely useful for subpicosecond x-ray detection because a high mobility, fast recovery material does not exist for x-ray excitation.

Thus, the present invention involves a photoconductive element having a relatively long duration or recombination time when compared to the pulse width of the high frequency signal to be measured. As such, the response of the photoconductive element with respect to the signal to be measured is characterized as a step-function of short duration. The present invention can utilize cheaper long duration photoconductive material because the desired response from the photoconductive element is a step-function not a rectangular function. Furthermore, the photoconductive element of the present invention is highly sensitive due to the high mobility typical of long duration photoconductive materials. Because the temporal resolution of the photoconductive element is limited by the pulse width of the optical pulse driving the photoconductive element, the temporal resolution of the photoconductive element is quite high due to the short pulse widths attainable.

In addition, the long-duration photoconductive element of the present invention has been specifically described as being utilized with a photoconductive sampler or detector. The present invention, however, can be utilized in a variety of applications where sensing high frequency signals is advantageous. Such applications include testing high frequency transmission and communication lines. Furthermore, the present invention has been described with optical signals which can include signals from infrared to extreme ultraviolet (such as X-rays).

What is claimed is:

1. A photoconductive step function sampler for sampling an electrical signal on a transmission line, said sampler comprising:

a photoconductive element made of a photoconductive material forming a gap on said transmission line, said photoconductive material having a recombination time longer than a pulse width of said electrical signal; and a step-function gate responsive to a probe beam, wherein said gap closes when hit with a pump beam that is synchronous to the probe beam, said pump beam being focused on the gap thereby causing the electrical signal to be sampled to traverse the transmission line toward the step-function gate for sampling.

2. The photoconductive step-function sampler of claim 1 wherein said photoconductive element responds to said electrical signal and an optical signal and producing a measured signal, said measured signal representing a cross-correlation between said electrical signal and a step-function response of said photoconductive material to said optical signal.

3. The photoconductive step-function sampler of claim 2 wherein said electrical signal is synchronized with said optical signal.

4. The photoconductive step-function sampler of claim 2 wherein said photoconductive element responds to a series of said electrical signal to produce measured signals for reconstructing said electrical signal.

5. The photoconductive step-function sampler of claim 2 wherein said photoconductive element is biased with a voltage.

6. A method for sampling an electrical pulse on a transmission line comprising the steps of:

providing a step-function gate of a photoconductive material in said transmission line, and producing a measured signal from said step-function gate in response to said electrical pulse and an optical signal wherein said measured signal represents the cross-correlation between said electrical pulse and a step-function response of said photoconductive material to said optical signal.

7. The method of claim 6 wherein said step of providing further includes the step of using a photoconductive material having a recombination time longer than a pulse width of said high frequency signal.

8. The method of claim 7 further including the step of synchronizing said optical signal and said electrical signal.

9. The method of claim 6 further including the step of biasing said photoconductive element with a voltage.

10. The method of claim 6 further including the steps of:

generating a series of electrical signals;

forming a measured waveform from said measured signals;

shifting said measured waveform by a time interval; and subtracting said shifted measured waveform from said measured waveform.

11. A photoconductive step-function detector for measuring an optical signal, said detector comprising:

a step-function gate of a photoconductive material, said step function gate responding to said optical signal by producing an electrical signal, said electrical signal being equivalent to the time integral of the optical signal to be measured; and means for acquiring the signal for analysis and display.

12. The photoconductive step-function detection of claim 11 wherein said photoconductive material having a recombination time longer than a pulse width of said optical signal.

13. The photoconductive step-function of claim 12 wherein said photoconductive element is biased by a voltage.

14. The photoconductive step-function of claim 12 wherein said photoconductive element responds to a series of said optical pulse to produce measured signals for reconstructing said optical pulse.

15. The photoconductive step-function of claim 11 wherein said measured signal is sampled by a conventional sampler.

16. A method for detecting an optical signal comprising the steps of:

providing a step-function element of a photoconductive material in a transmission line; and detecting a measurement signal on the transmission line wherein the measurement signal represents a time integral of the optical signal and wherein the time integral represents a correlation between the optical signal and a response of the photoconductive material to the optical signal.

17. The method of claim 16 wherein said step of providing includes said photoconductive material having a recombination time longer than a pulse width of said optical signal.

18. The method of claim 17 further comprising the step of biasing said photoconductive element with a voltage.

19. The method of claim 17 further comprising the step of sampling said measurement signal with a conventional sampler.

20. The method of claim 17 wherein said optical signal is an x-ray.

21. The method of claim 17 wherein said step of responding is repeated for a series of said optical signal.

* * * * *